United States Patent
Wu et al.

(10) Patent No.: US 9,716,097 B2
(45) Date of Patent: Jul. 25, 2017

(54) TECHNIQUES TO AVOID OR LIMIT IMPLANT PUNCH THROUGH IN SPLIT GATE FLASH MEMORY DEVICES

(71) Applicant: Taiwan Semiconductor Manufacturing Co., Ltd., Hsin-Chu (TW)

(72) Inventors: Chang-Ming Wu, New Taipei (TW); Shih-Chang Liu, Alian Township (TW); Sheng-Chieh Chen, Taichung (TW); Yung-Chang Chang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 113 days.

(21) Appl. No.: 14/596,340

(22) Filed: Jan. 14, 2015

(65) Prior Publication Data
US 2016/0204118 A1    Jul. 14, 2016

(51) Int. Cl.
| | |
|---|---|
| H01L 27/115 | (2017.01) |
| H01L 27/11521 | (2017.01) |
| H01L 29/423 | (2006.01) |
| H01L 21/265 | (2006.01) |
| H01L 21/3213 | (2006.01) |
| H01L 21/311 | (2006.01) |
| H01L 29/788 | (2006.01) |
| H01L 27/11534 | (2017.01) |

(52) U.S. Cl.
CPC .. *H01L 27/11521* (2013.01); *H01L 21/26513* (2013.01); *H01L 21/31116* (2013.01); *H01L 21/32137* (2013.01); *H01L 21/32139* (2013.01); *H01L 27/11534* (2013.01); *H01L 29/42328* (2013.01); *H01L 29/7881* (2013.01); *H01L 2924/0002* (2013.01)

(58) Field of Classification Search
CPC .................. H01L 29/7881; H01L 27/11517
USPC ................... 257/326, 900; 438/258, 266
See application file for complete search history.

(56) References Cited

U.S. PATENT DOCUMENTS

| | | | |
|---|---|---|---|
| 8,669,607 B1 * | 3/2014 | Tsair | H01L 29/7881 257/316 |
| 8,951,864 B2 | 2/2015 | Wang et al. | |
| 2013/0242659 A1 | 9/2013 | Yu et al. | |

FOREIGN PATENT DOCUMENTS

KR    1020070069626 A    7/2007

* cited by examiner

*Primary Examiner* — Mark Prenty
(74) *Attorney, Agent, or Firm* — Eschweiler & Potashnik, LLC

(57) ABSTRACT

Some embodiments of the present disclosure relate to a flash memory device. The flash memory device includes first and second individual source/drain (S/D) regions spaced apart within a semiconductor substrate. A common S/D region is arranged laterally between the first and second individual S/D regions, and is separated from the first individual S/D region by a first channel region and is separated from the second individual S/D region by a second channel region. An erase gate is arranged over the common S/D. A floating gate is disposed over the first channel region and is arranged to a first side of the erase gate. A control gate is disposed over the floating gate. A wordline is disposed over the first channel region and is spaced apart from the erase gate by the floating gate and the control gate. An upper surface of the wordline is a concave surface.

20 Claims, 8 Drawing Sheets

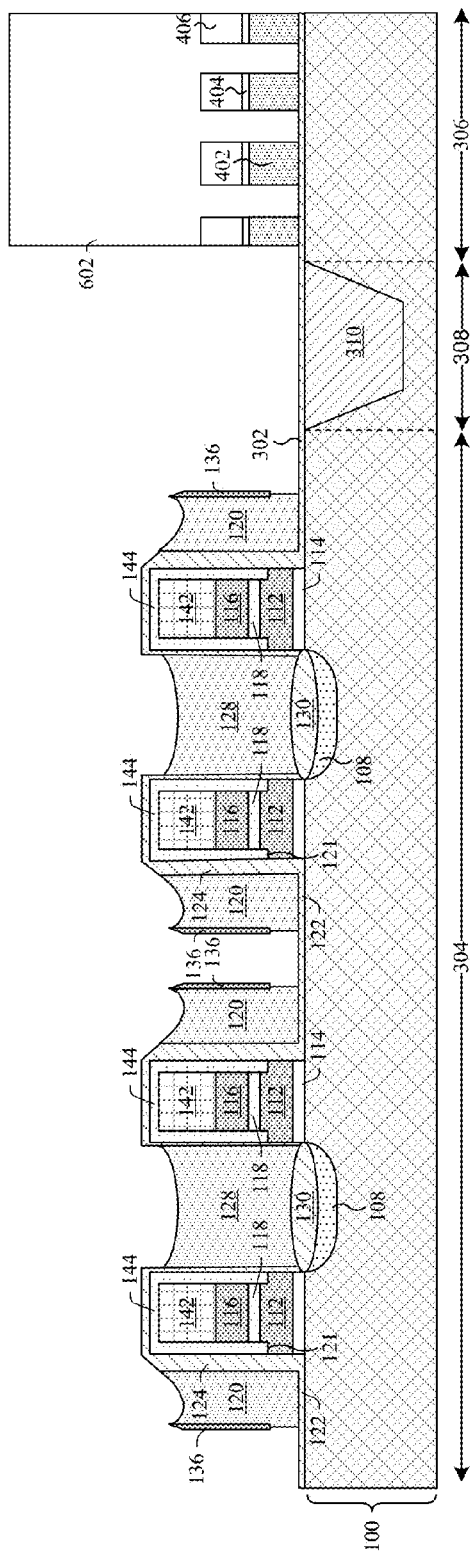
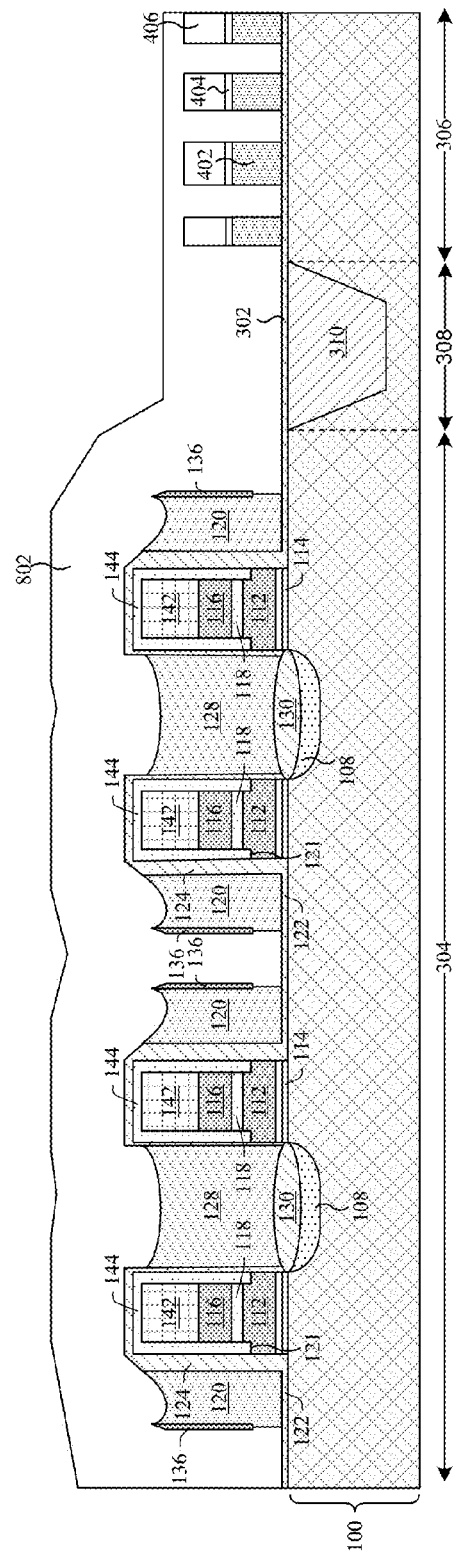
Fig. 7
Fig. 8

TECHNIQUES TO AVOID OR LIMIT IMPLANT PUNCH THROUGH IN SPLIT GATE FLASH MEMORY DEVICES

BACKGROUND

A trend in the semiconductor manufacturing industry is to integrate different circuit elements, including logic, memory, processors, peripherals, etc., on a common semiconductor substrate. Such integration can lower manufacturing costs, simplify manufacturing procedures, and increase operational speed of the resultant circuit compared to approaches where the circuit elements are made on separate ICs and then electrically coupled to one another on a printed circuit board. One type of integrated device is an embedded flash memory device. An embedded flash memory device can include an array of flash memory cells and logic circuits that support operation of the flash memory cells, and can optionally include processors, peripherals, and the like.

One type of flash memory cell that can be used in embedded flash devices is a split-gate flash memory cell, such as a third generation SUPERFLASH (ESF3) memory cell. Compared to earlier generations of flash memory cells, split-gate flash memory cells have lower power consumption, higher injection efficiency, less susceptibility to short channel effects, and over erase immunity. As such, split-gate flash memory cells are becoming more prevalent in today's memory and embedded products.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3-14 illustrate a series of cross-sectional views of an embedded flash memory device at intermediate stages of manufacture in accordance with some embodiments.

DETAILED DESCRIPTION

Figure 1A:
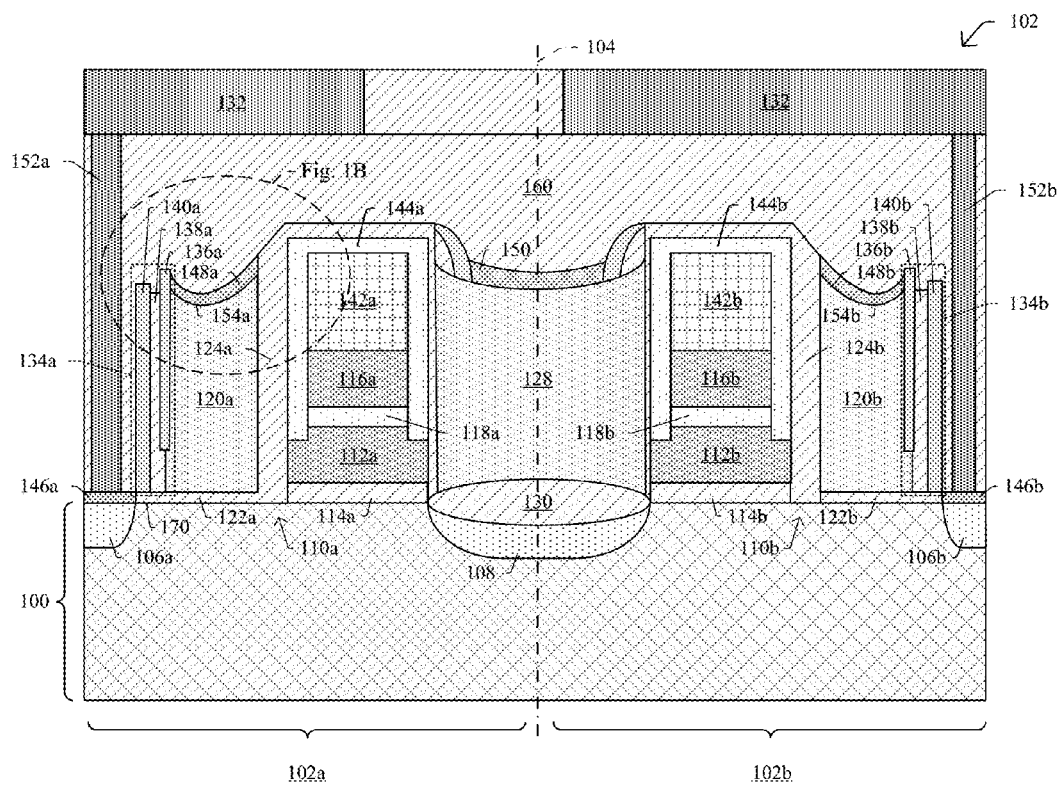
FIG. 1A illustrates a cross-sectional view of some embodiments of an embedded flash memory device with a split-gate flash memory cell device.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some flash memory devices include a memory array made up of a large number of pairs of split-gate flash memory cells (e.g., EFS3 memory cells), arranged for example in rows and columns. A pair of split-gate flash memory cells typically a common source/drain regions, which is shared by the cells of the pair, and first and second individual source/drain regions on opposite sides of the common source/drain region. Thus, a first channel region extends between the first individual S/D region and the common S/D region, and a second channel region extends between the common S/D region and the second individual S/D region. A first wordline, corresponding to the first memory cell, is formed over the first channel region; while a second wordline, corresponding to the second memory cell, is formed over the second channel region. These wordlines have top surfaces that each slope continuously downward from a central portion of the split gate pair to outer regions of the split gate pair, much like a person's shoulders slope downward from his or her neck (central region) toward outer edges of his or her arms. During manufacture, these wordlines are formed prior to the individual source/drain regions, where the individual source/drain regions can be formed through ion implantation with the wordlines in place. The wordlines are expected to have sufficient thickness to block the ions, which are used to form the individual source/drain regions, from reaching the first and second channel regions. Because the shoulder-like contours of the wordlines result in outer edges of the wordlines being short or thin, the ions used to form the individual source/drain regions can inadvertently punch through these thin outer edges of the wordline and end up in the outer portions of the channel regions. This can adversely affect the voltage thresholds associated with the memory cells, and in extreme cases can lead to failure of the memory cells.

In view of the foregoing, the present application is directed to techniques whereby a pair of split gate memory cells have wordline upper surfaces that are each concave in shape, rather than having continuously downwardly sloping contours (e.g., shoulder-like contours). In effect, relative to shoulder-like contours, the concave wordline upper surface can "pull up" the outer edges of the wordlines so they are sufficiently thick to block ions during source/drain implantation and thereby limit or avoid ion implant punch through. Thus, the concave wordline upper surface can help provide flash memory arrays with more uniform threshold voltages over the entire array, which can provide more reliable read/write operations and/or better performance. As will be appreciated in more detail below, to achieve this concave-shape, some embodiments of the present disclosure make use of composite sidewall spacers that are disposed along the outer sidewalls of the wordlines.

Referring now to FIG. 1A, a cross-sectional view of some embodiments of an embedded flash memory device is provided. The illustrated embedded flash memory device is disposed on semiconductor substrate 100 and includes a split gate flash pair 102 made up of a first flash memory cell 102a and a second flash memory cell 102b, which can be mirror images of one another about a central axis 104. The first and second split-gate flash memory cells 102a, 102b can each store one or more bits of data in a nonvolatile manner.

More particularly, the pair 102 includes first and second individual source/drain (S/D) regions 106a, 106b, which are spaced apart within the substrate 100. A common S/D region 108 is arranged laterally between the first and second individual S/D regions 106a, 106b. The common source 108 is separated from the first individual S/D region 106a by a first channel region 110a, and is separated from the second individual S/D region 106b by a second channel region 110b. A first floating gate 112a is disposed over the first channel region 110a and is separated therefrom by a tunnel dielectric 114a, and a first control gate 116a is disposed over the first floating gate 112a and is separated therefrom by a control gate dielectric 118a. A first wordline 120a is also disposed over the first channel region 110a, and has an outer wordline sidewall facing towards the first individual S/D region 106a. A horizontal wordline dielectric 122a separates the first wordline 120a from the first channel region 110a, and a vertical wordline dielectric 124a separates the first wordline 120a from the first floating gate 112a and first control gate 116a. A first hardmask 142a can also be present over the first control gate 116a, and a first dielectric cap 144a can cover first hardmask 142a, sidewalls of first control gate 116a, sidewalls of first control dielectric 118a, and rest on a ledge within first floating gate 112a.

Similarly, the second memory cell 102b includes second floating gate 112b, a second control gate 116b, and a second wordline 120b, and other corresponding structures denoted with a "b" after corresponding reference numerals. An erase gate 128 is arranged over the common source 108, with an erase gate dielectric 130 separating the erase gate 128 from the common source 108. Interlayer dielectric (ILD) 160 is disposed over the erase gate 128 and separates erase gate 128 from a metallization interconnect layer 132. Vias (e.g., 152a, 152b), some of which are outside of the plane of the illustrated cross-section and thus not explicitly depicted, extend downward from metallization interconnect layer 132 and connect to source/drain silicide regions 146a/146b, wordline silicide regions 148a/148b, and erase gate silicide region 150.

Figure 1B:
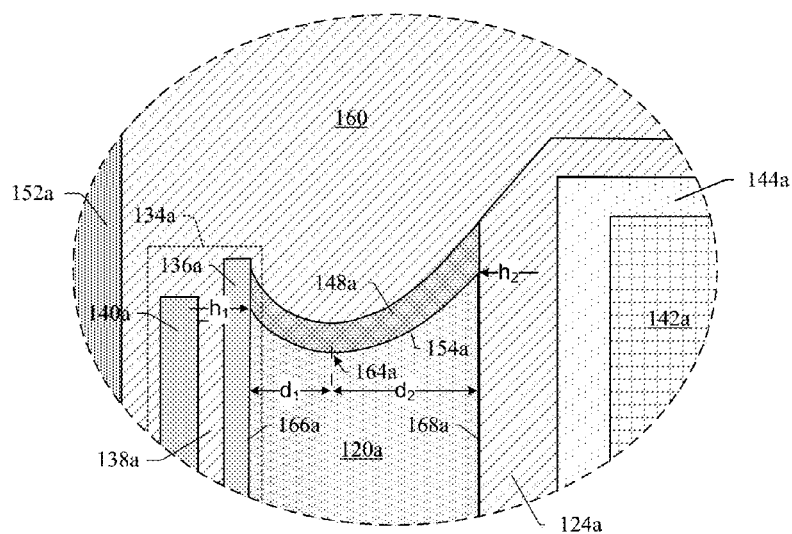
FIG. 1B illustrates a cross-sectional view corresponding to an inset region of FIG. 1A.

Notably, to help limit ion implantation punch through during manufacturing, wordline upper surfaces 154a, 154b are concave in shape. As shown in more detail in FIG. 1B, the concave surfaces have a bottom region (e.g., 164a), which is spaced laterally apart from the outer wordline sidewall (e.g., 166a) by a first distance, $d_1$, and which is spaced laterally apart from an inner wordline sidewall (e.g., 168a) by a second distance, $d_2$. The first distance, $d_1$, is smaller than the second distance, $d_2$. In other words, the bottom region 164a is off-center within the wordline upper surface 154a, and is closer to the outer wordline sidewall 166a than the inner wordline sidewall 168a. Further, in some embodiments an outermost side of the concave surface 154a, which is adjacent to the outer wordline sidewall 166a, has a first height, $h_1$, as measured from upper substrate surface (170, FIG. 1A); and an innermost side of the concave surface 154a, which is adjacent to inner wordline sidewall 168a, has a second height, $h_2$, that is greater than the first height, $h_1$. The bottom region 164a can vertically fall within the hardmask 142a, for example, having a height that ranges from 10% of the height to 99% of the height of the top of hardmask 142a, as measured from an upper surface of the substrate 170 in some embodiments. Again, compared to wordlines with continuously downwardly sloping top surfaces (e.g., shoulder-like contours), concave wordline upper surfaces 154a, 154b can "pull up" the outer edges of the wordlines so they are sufficiently thick to block ions during source/drain implantation and thereby limit or avoid ion implant punch through in channel regions 110a, 110b.

Referring back to FIG. 1A, to help facilitate formation of these concave surfaces 154a, 154b, some embodiments include first and second composite spacers 134a, 134b disposed along the outer sidewalls of the first and second wordlines 120a, 120b, respectively. The first composite spacer 134a includes a first inner layer 136a covering an upper region of the outer wordline sidewall but leaving a lower region of the outer wordline sidewall un-covered. A first outer layer 138a extends along an outer sidewall of the first inner layer 136a and extends downward along the un-covered lower region of the outer wordline sidewall. A first outermost layer 140a extends along an outer sidewall of the first outer layer 138a.

In some embodiments, the first inner layer 136a is made of SiN and has a thickness ranging between 20 angstroms and 100 angstroms. In some embodiments, the first outer layer 138a is made of oxide and has a thickness ranging between 100 angstroms and 200 angstroms. In some embodiments, the first outermost layer 140a is made of SiN and has a thickness ranging between 200 angstroms and 300 angstroms. In some embodiments, the first outer layer 138a has an uppermost surface that corresponds to the upper 20% to 99% of the height of hard mask 142a, or even 50% to 95% of the height of hard mask 142a, as measured from upper substrate surface 170.

During operation, the memory cells 102a, 102b, independently store variable amounts of charge, such as electrons, in their floating gates 112a, 112b, respectively. The amount of charge stored on the floating gates 112a, 112b represents data states, such as single-bit or multi-bit values, stored in the respective cells 102a, 102b, and can be varied through program, read, and erase operations. These operations are performed on a cell through selective biasing of the cell's source/drain regions 106/108, control gate 116, word line 120, and the erase gate 128. A non-limiting example of a set of program, read, and erase operations is now described below with regards to the first memory cell 102a. It will be appreciated that the second memory cell 102b can operate independently in a similar manner, and that the voltages set forth below are merely examples and actual voltage biases can vary widely depending on the precise memory architecture and technology node employed.

During a program operation of the first memory cell 102a, a wordline bias (e.g., +1V) is applied to the wordline 120a and a larger magnitude voltage (e.g., +11V) is applied to the control gate 116a, thereby inducing formation of a conductive channel in the channel region 110a. While this bias condition is applied, a positive voltage (e.g., +5 volt) is concurrently applied to both the common source/drain 108 and erase gate 128 to induce electrons to flow from the individual source/drain 106a towards the common source/drain 108. The high bias voltage on the control gate 116a promotes Fowler-Nordheim tunneling of carriers from the channel region 110a towards the control gate 116a. As the carriers tunnel towards the control gate 116a, at least some carriers become trapped in the floating gate 112a, and thus alter the voltage threshold of the memory cell 102a to correspond to a predetermined voltage threshold associated with a program data state (e.g., logical "1").

During an erase operation of the first memory cell 102a, the erase gate 128 is biased with a high voltage (e.g., +13V) while the control gate 116a and wordline 120a are each held at a low voltage (e.g., 0 V). The high bias erase gate voltage promotes Fowler-Nordheim tunneling of carriers from the floating gate 112a towards the erase gate 128. As the carriers tunnel towards the erase gate 128, the electrons which were trapped in the floating gate 112a are now stripped or otherwise removed from the floating gate 112a, and thus alter the voltage threshold of the memory cell 102a to correspond to a predetermined voltage threshold associated with an erase data state (e.g., logical "0").

Because charge stored in the floating gate 112a screens an electric field formed between the control gate 116a and the channel region 110a, the charge stored on the floating gate 112a can alter the threshold voltage $V_{th}$ of the memory cell 102a by an amount $\Delta V_{th}$. Therefore, during a read operation of the first memory cell 102a, the word line 120a is biased (e.g., +3V) and the control gate 116a is biased with a read voltage (e.g., +2V), which is greater than $V_{th}$, but less than $V_{th}+\Delta V_{th}$. Depending on whether current flows between individual source/drain region 106a and common source drain region 108 (or not), read circuitry of the memory device can correspondingly determine whether the memory cell 102a is in the program state (e.g., logical "1") or erase state (logical "0").

Figure 2:
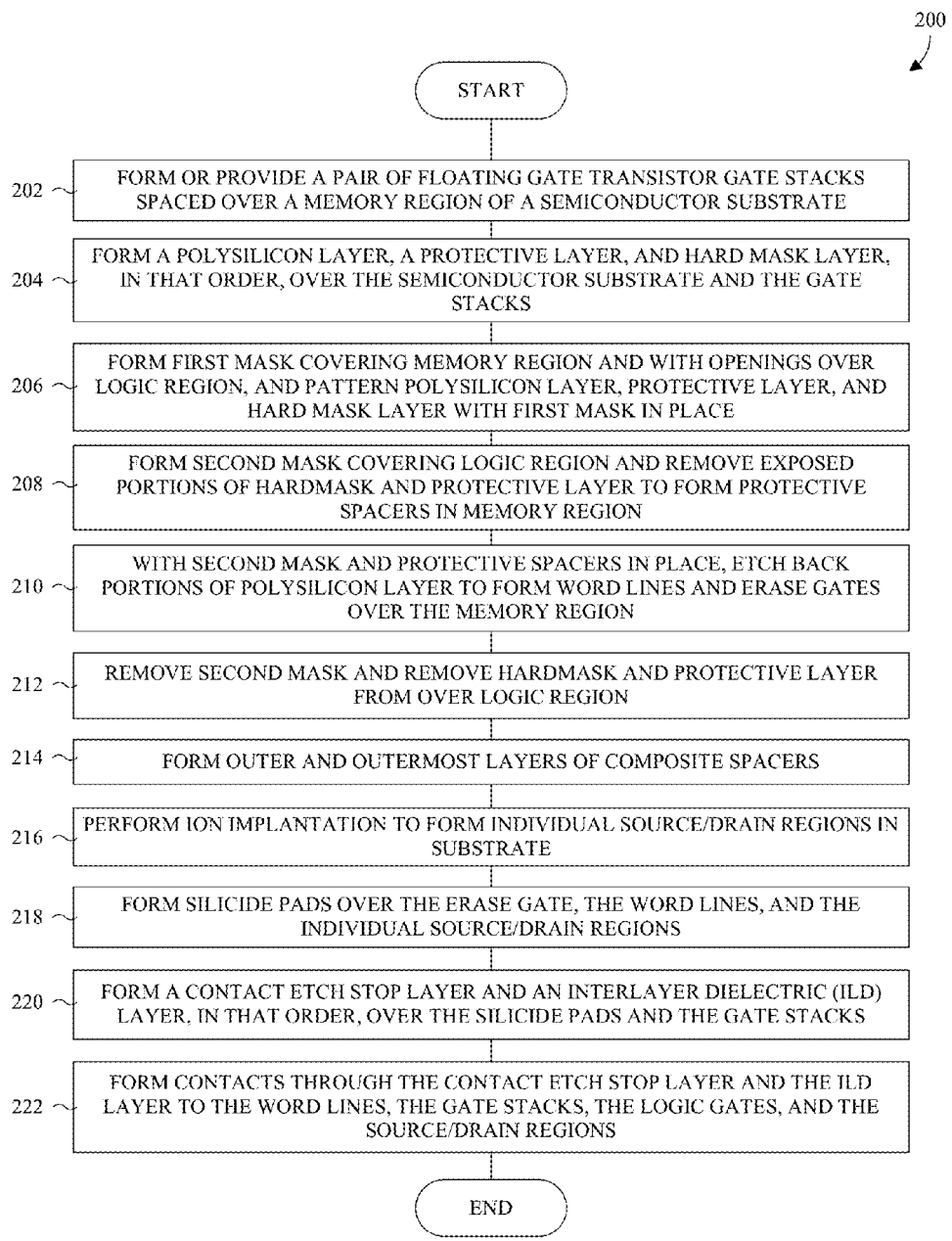
FIG. 2 illustrates a flow chart of some embodiments of a method for manufacturing an embedded flash memory device having a split-gate flash memory cell device.

With reference to FIG. 2, a flowchart 200 provides some embodiments of a method for manufacturing an embedded flash memory device having a split-gate flash memory cell and a low power logic device.

At 202, a pair of floating transistor gate stacks are formed to be spaced apart over a memory region of a semiconductor substrate At 204, a polysilicon layer, a protective layer, and a hard mask layer are formed, in that order, over the semiconductor substrate and the gate stacks.

At 206, a first mask is formed to cover the memory region. The first mask has openings over the logic region, and is used to pattern the polysilicon layer, protective layer, and hard mask layer in the logic region.

At 208, a second mask is formed to cover the logic region and to expose the memory region. With the second mask in place, an etch is performed to remove exposed portions of the hard mask and protective layer to form protective spacers in the memory region.

At 210, with the second hard mask and protective spacers in place, exposed portions of the polysilicon layer are etched back to form wordlines and erase gates over the memory region.

At 212, the second mask is removed, and subsequently the hard mask and protective layer are removed from over the logic region.

At 214, outer and outermost layers of composite spacers are formed on inner and outer sidewalls of the wordlines.

At 216, dopants are implanted into the semiconductor substrate to form individual source/drain regions which are self-aligned to edges of the word lines in the memory region and which are self-aligned to edges of the logic gates in the logic region.

At 218, a contact etch stop layer and an interlayer dielectric (ILD) layer are formed, in that order, over the silicide pads and gate stacks.

At 220, contacts are formed through the contact etch stop layer and the ILD layer to the word lines, the gate stack, the erase gate, the logic gates, and the source/drain regions.

Advantageously, the method provides wordlines that have upper surfaces that are concave in shape. Because the outer edges of these wordline upper surfaces tip upwards, the wordlines have sufficient thickness to substantially block or completely block ions, which are directed towards the substrate to form the individual source/drain regions. Hence, this methodology can provide memory devices with better characteristics and/or performance than previous approaches.

While the disclosed methods (e.g., the method described by the flowchart 200) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 3-14 cross-sectional and top views of some embodiments of an embedded flash memory device at various stages of manufacture are provided to illustrate the method of FIG. 2. Although FIGS. 3-14 are described in relation to the method, it will be appreciated that the structures disclosed in FIGS. 3-14 are not limited to the method, but instead may stand alone as structures independent of the method. Similarly, although the method is described in relation to FIGS. 3-14, it will be appreciated that the method is not limited to the structures disclosed in FIGS. 3-14, but instead may stand alone independent of the structures disclosed in FIGS. 3-14.

Figure 3:
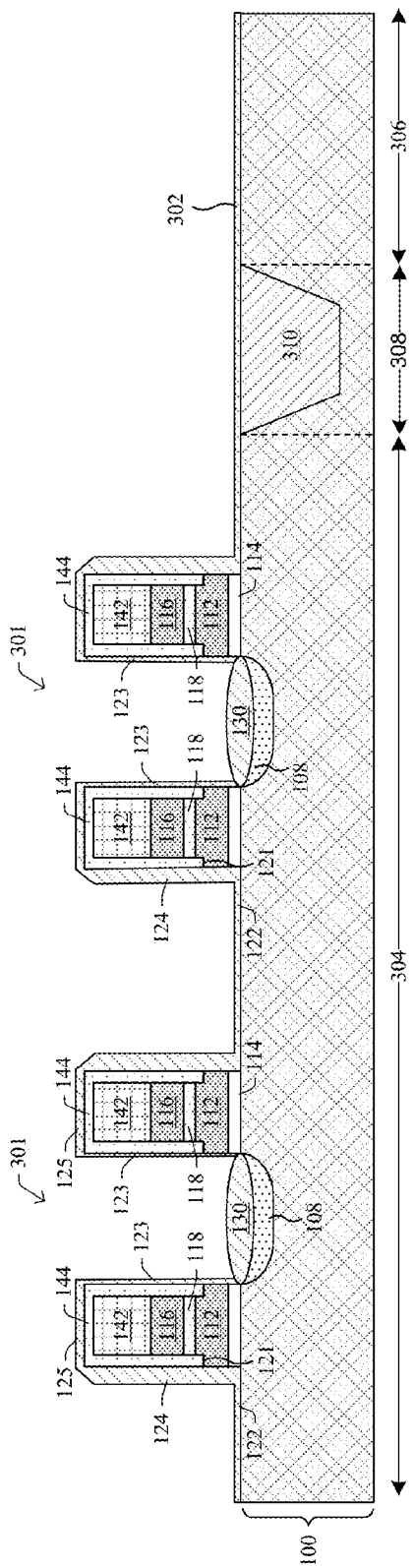

FIG. 3 illustrates a cross-sectional view of some embodiments corresponding to Act 202 of FIG. 2.

As illustrated by FIG. 3, two pair of floating transistor gate stacks 301 are formed over a memory region 304 of a semiconductor substrate 100, although it will be appreciated that a large number of gate stacks, such as thousands, millions, billions, etc., are often formed over the memory region 304 to establish an array of memory cells. The memory region 304 is spaced apart from a logic region 306 of the semiconductor substrate 100 by an intermediate region 308 of the semiconductor substrate 100. The intermediate region 308 includes an isolation structure 310, such as a shallow trench isolation (STI) structure made up of dielectric material, that isolates memory cell devices over the memory region 304 from logic devices over the logic region 306.

Each gate stack 301 includes a tunnel dielectric region 114, a floating gate 112, a control gate dielectric region 118, a control gate 116, and a hard mask 142. The floating gates 112 are arranged over the memory region 304 with the tunnel dielectric regions 114 separating the substrate 100 and the floating gates 112. Further, the floating gates 112 include floating gate ledges 121 exhibiting a reduced height relative to a top surface of the floating gates 112 and extending alongside and/or around a core region of the floating gates 112. The control gates 116 are arranged over the core region with the control gate dielectric regions 118 separating the core regions and the control gates 116. The hard masks 142 are arranged over the control gates 116, and are, for example, silicon nitride. In some embodiments, the hard masks 142 have a thickness of about 1000 Angstroms.

Also illustrated by FIG. 3, dielectric caps 144 corresponding to the gate stacks 301 are formed on the floating gate ledges 121. The dielectric caps 144 line sidewalls of the control gate dielectric regions 118, the control gates 116, and the hard masks 142, and extend over top surfaces of hard masks 142. Further, a first dielectric layer 302 is formed or provided to line the gate stacks 301, the dielectric caps 144, and the semiconductor substrate 100. The first dielectric layer 302 includes horizontal and vertical wordline dielectrics 122, 124, as well as an erase gate dielectric region 123 arranged over a common source/drain region 108 between gate stacks 301. An upper dielectric region 125 extends over top of the dielectric caps 144. The first dielectric layer 302 is, for example, an oxide, such as silicon dioxide.

The horizontal and vertical wordline dielectrics 122, 124, as well as the erase gate dielectric region 123 and upper dielectric region 125 can be the same as one another or different from one another. For example, in some embodiments, the horizontal and vertical wordline dielectrics 122, 124 can each include multiple layers, such as a first oxide layer, a nitride layer over the first oxide layer, and a second oxide layer over the nitride layer (so called ONO structure); while in other embodiments one or both of the horizontal and vertical wordline dielectrics 122, 124 can consist of a single dielectric layer, such as a silicon dioxide layer or high-k dielectric for example.

The semiconductor substrate 100 is typically planar with a substantially uniform thickness. Further, the semiconductor substrate 100 can be n- or p-type, and can, for example, be a bulk silicon wafer or a silicon-on-insulator (SOI) substrate. If present, an SOI substrate is often made up of an active layer of high quality silicon, which is arranged over a handle wafer and is separated from the handle wafer by a buried oxide layer. In some other embodiments, the semiconductor substrate can also be a sapphire substrate, a binary compound substrate (e.g. a III-V substrate), or other higher order compound substrate (e.g. AlGaAs), with or without additional insulating or conducting layers formed thereover, among others.

Figure 4:
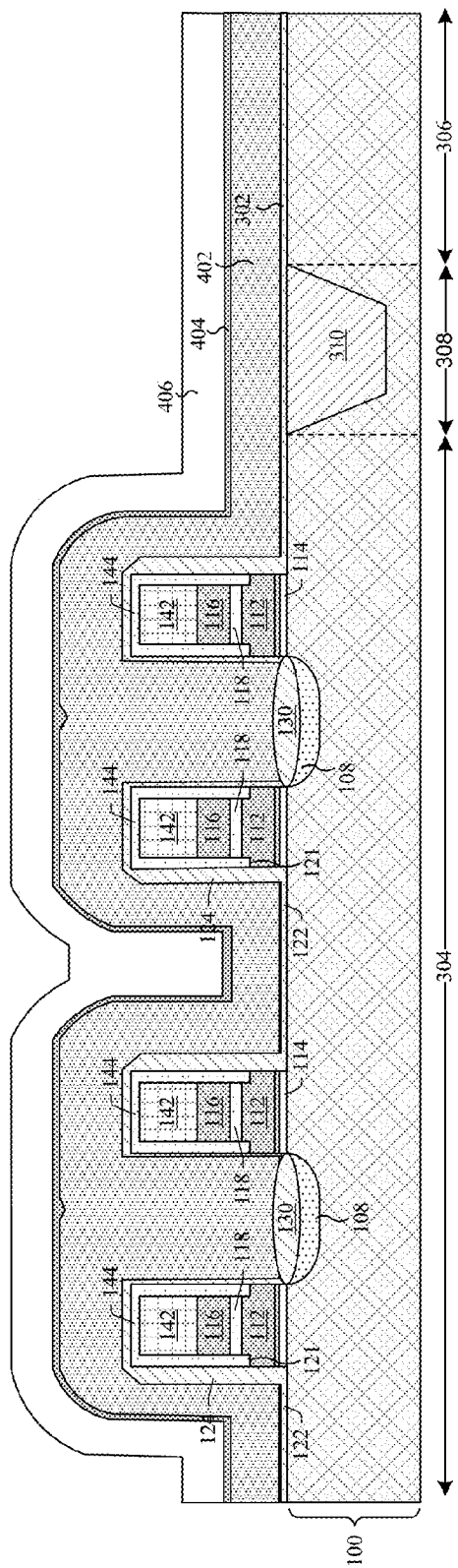

FIG. 4 illustrates a cross-sectional view of some embodiments corresponding to Act 204 of FIG. 2.

As illustrated by FIG. 4, a polysilicon layer 402, a protective layer 404, and a hard mask layer 406 are formed conformally in that order over the semiconductor substrate 100 and the gate stacks 301. The protective layer 404 can be a SiN layer which is formed by atomic layer deposition (ALD). The hard mask layer 406 is, for example, an oxide, such as silicon dioxide. In some embodiments, the polysilicon layer 402 has a thickness ranging between 400 angstroms and 1000 angstroms, being about 700 Angstroms in some cases; the protective layer 404 can have a thickness of between 40 angstroms and 120 angstroms; and the hard mask layer 406 can have a thickness ranging between 600 angstroms and 2000 angstroms, being about 1200 Angstroms in some cases.

Figure 5:
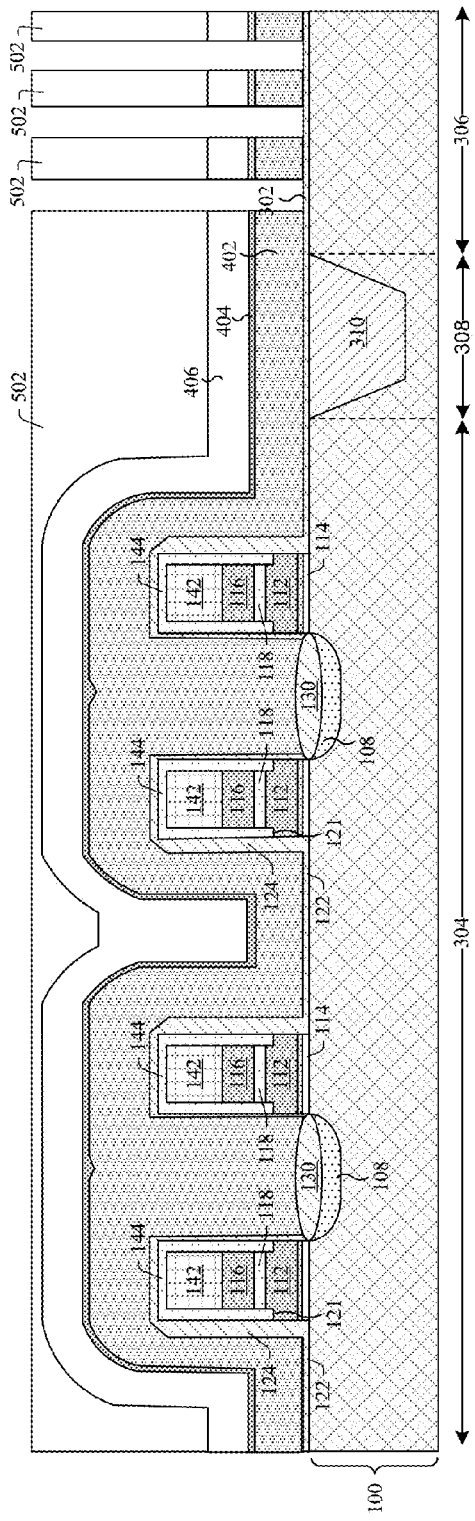

FIG. 5 illustrates a cross-sectional view of some embodiments corresponding to Act 206 of FIG. 2.

As illustrated by FIG. 5, a first mask 502 is formed over the substrate 100. The first mask 502 covers the memory region 304 and intermediary region 308, and has openings over the logic region 306. In some embodiments, the first mask 502 is a tri-layer photoresist, which includes a first organic layer, an inorganic layer disposed over the first organic layer, and a second organic layer disposed over the inorganic layer. As further illustrated by FIG. 5, a first etch is performed with the first mask 502 in place. The first etch patterns the hard mask layer 406, protective layer 404, and polysilicon layer 402 to form polysilicon gate structures in the logic region 306.

Figure 6:
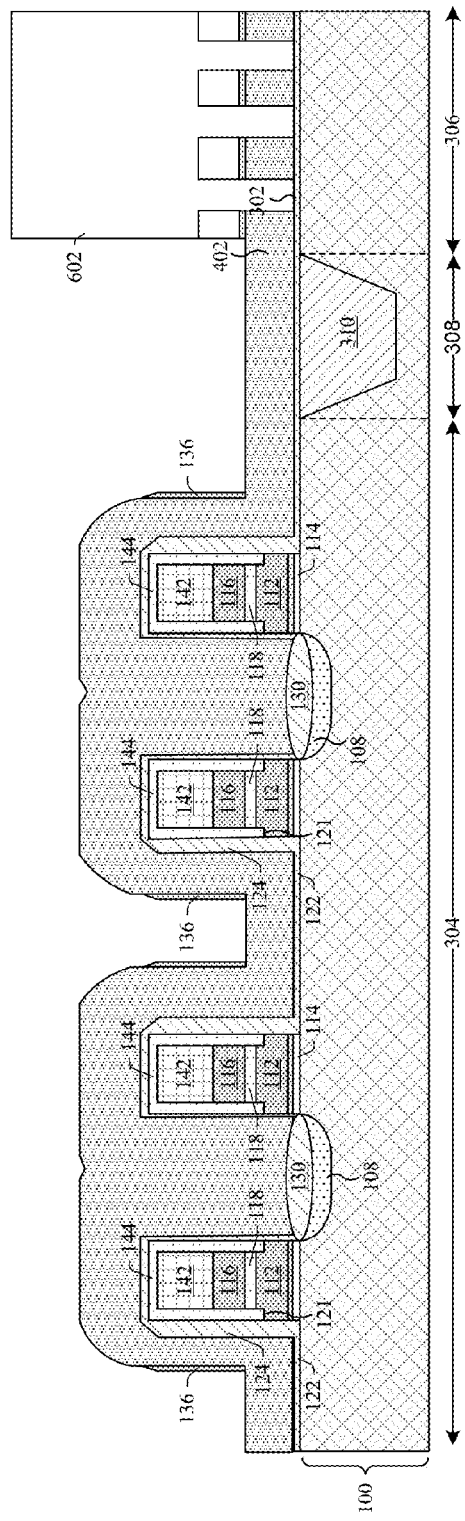

FIG. 6 illustrates a cross-sectional view of some embodiments corresponding to Act 208 of FIG. 2.

As illustrated by FIG. 6, the first mask 502 is removed, and a second mask 602 is formed to cover the logic region 306. An etch is performed with this second mask 602 in place to remove the exposed portions of the hard mask 406. An etch back process, which may be referred to as a breakthrough etch, is then performed to etch back regions of the protective layer 404 while leaving underlying portions of the polysilicon layer 402 in place, thereby leaving protective sidewall spacers 136 on sidewalls of the polysilicon layer 402. In some embodiments, this breakthrough etch may use a transformer coupled capacitive tuning (TCCT) plasma with the following process conditions: pressure of 10 mTorr, a TCCT parameter of 0.5, a power of 440 watts, a bias of 120 V, for a predetermined time of 10 seconds, with CF4 gas supplied to the plasma chamber at a flow rate of 150 sccm, and an electrostatic chuck temperature of 50s degree Celsius.

FIG. 7 illustrates a cross-sectional view of some embodiments corresponding to Act 210 of FIG. 2.

As illustrated by FIG. 7, with the second mask 602 still in place, an etch back procedure is performed to etch the polysilicon layer 402 back to the upper surface of upper dielectric regions 125. In performing this etch back, a polysilicon erase gate 128 is formed over the erase gate dielectric region 130 between the gate stacks 301, and wordlines 120 are formed on outer sides of the gate stacks 301. In some embodiments, this etch back procedure may be a two-part etch that results in a concave wordline upper surface. The first part of this two part etch is highly-directional (e.g., vertical or substantially vertical), but is relative non-selective between polysilicon and oxide. The second part of this two-part etch is less directional, but is selectively between polysilicon and oxide. In some embodiments, the first part of this two-part etch may use a TCCT plasma with the following process conditions: pressure of 7 mTorr, a TCCT parameter of 0.5, a power of 550 watts, a bias of 40 V, for a predetermined time of between 35 and 40 seconds, with a mixture of O2, He, and HBr gas supplied to the plasma chamber, and an electrostatic chuck temperature of 50 degrees Celsius. In some embodiments, the second part of this two-part etch may use a TCCT plasma with the following process conditions: pressure of 80 mTorr, a TCCT parameter of 0.5, a power of 380 watts, a bias of 120 V, for a predetermined time of 15 seconds, with a mixture of O2, He, and HBr gas supplied to the plasma chamber, and an electrostatic chuck temperature of 50 degrees Celsius.

Notably, to help limit ion implantation punch through during subsequent processing, wordline upper surfaces 154 which are formed by this etch back procedure are concave in shape. The concave surfaces have a bottom region, which is spaced laterally apart from the outer wordline sidewall by a first distance, $d_1$, and which is spaced laterally apart from an inner wordline sidewall by a second distance, $d_2$. The first distance, $d_1$, is smaller than the second distance, $d_2$. In other words, the bottom region is off-center within the wordline upper surface 154, and is closer to the outer wordline sidewall than the inner wordline sidewall. The etch back process may also slightly undercut the protective spacers 136, thereby exposing a lower surface of the protective spacers and also exposing lower outer sidewalls of the wordlines 120.

Figure 9:
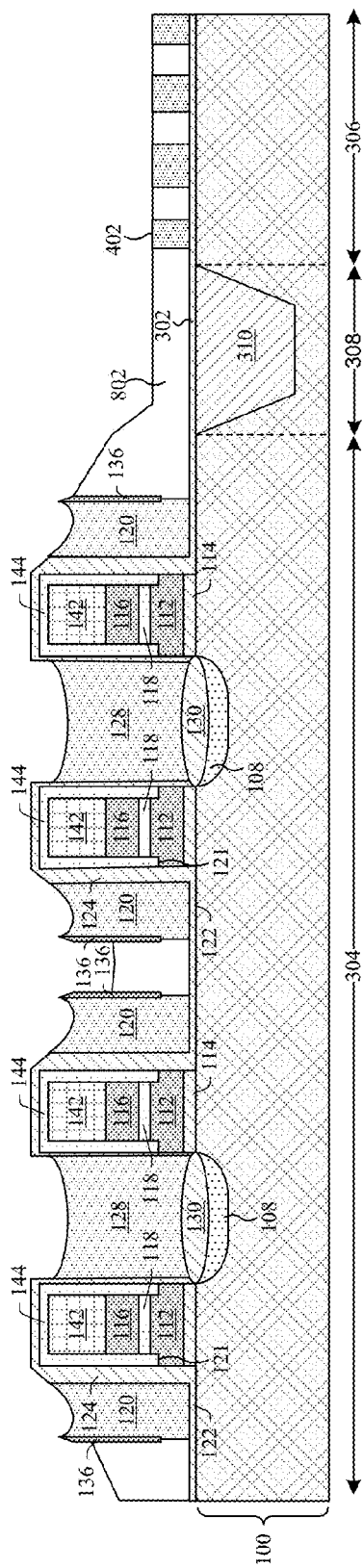

FIGS. 8-9 illustrate cross-sectional views of some embodiments corresponding to Act 212 of FIG. 2.

As illustrated by FIG. 8, photoresist 802 is applied over the structure. As illustrated by FIG. 9, the photoresist 802 is etched back over the structure for example by an ashing process, and the hard mask 406 and protective layer 404 are removed from over the logic region 306.

Figure 10:
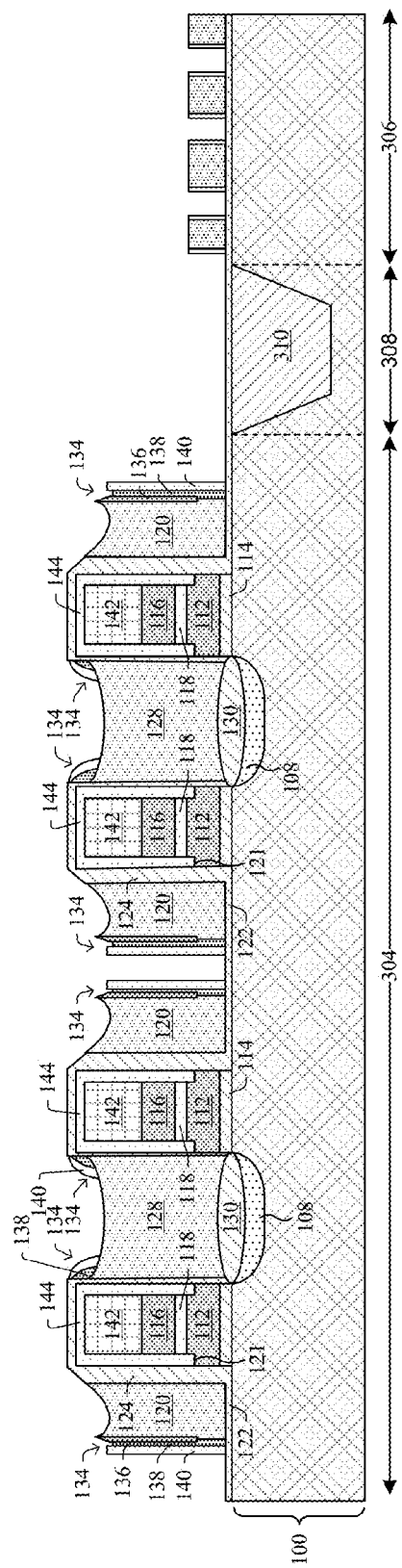

FIG. 10 illustrates a cross-sectional view of some embodiments corresponding to Act 214 of FIG. 2.

As illustrated by FIG. 10, the remaining photoresist 802 is removed, and composite spacers 134 are formed on exposed sidewalls of the structure. To form these composit spacers 134 in some embodiments, a conformal oxide layer having a thickness in the range of 100 angstroms to 200 angstroms is formed over the structure, and then a conformal silicon nitride (SiN) layer having a thickness in the range of 200 angstroms to 300 angstroms is formed over the conformal oxide layer. An anisotropic etch (e.g., a vertical plasma etch) can then be carried out to reduce the vertical thickness of the conformal oxide and SiN layers, thereby providing an outer layer 138 made of oxide and an outermost layer 140 made of SiN.

Figure 11:
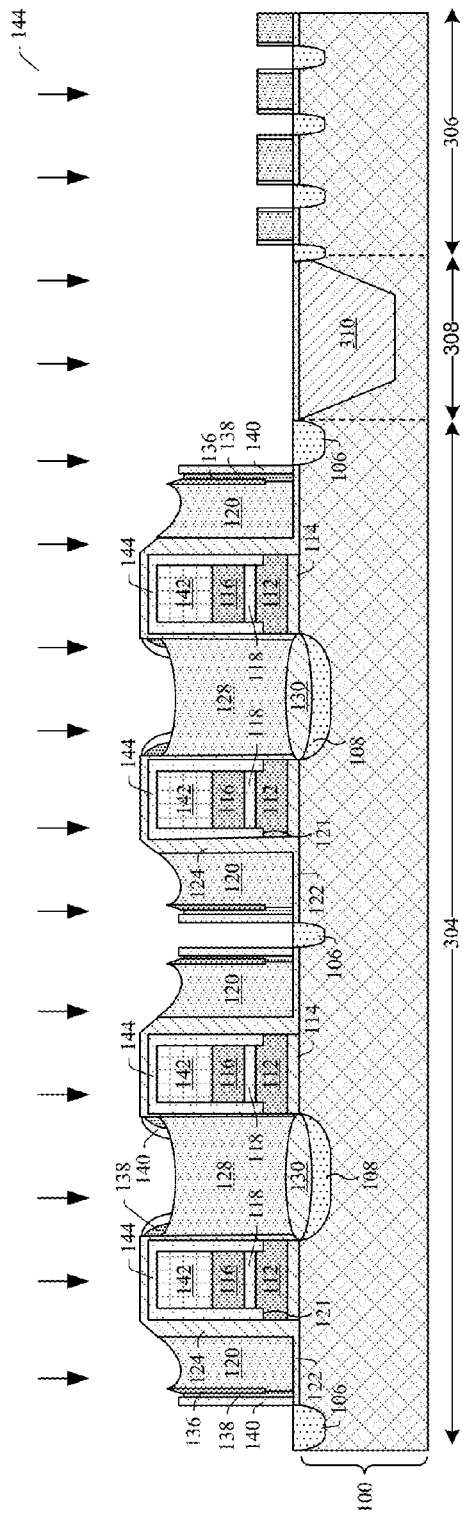

FIG. 11 illustrates a cross-sectional view of some embodiments corresponding to Act 216 of FIG. 2.

As illustrated by FIG. 11, dopants are implanted into the wordlines 120 and erase gates 128. The dopants may be n-type or p-type, but are typically n-type. In some embodiments, after implanting the dopants, the doped wordlines 120 and the doped erase gate 128 undergo an annealing process. The dopants can also form individual source/drain regions 106 of the split gate flash cells, and optionally source/drain regions in the logic region 306.

Figure 12:
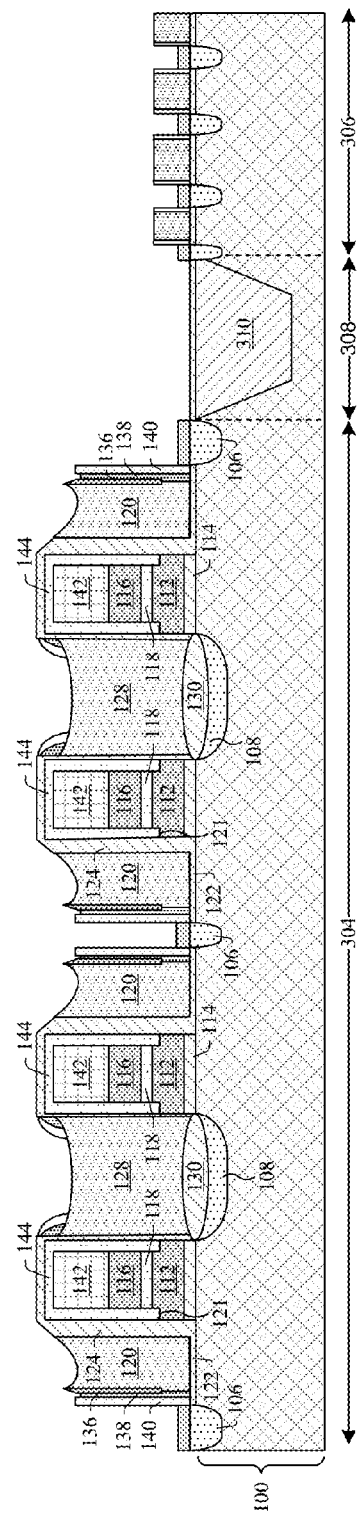

FIG. 12 illustrates a cross-sectional view of some embodiments corresponding to Act 218 of FIG. 2.

As illustrated by FIG. 12, silicide pads 146, 148, 150 are formed over the individual source/drain regions 106 and over the logic source/drain regions, as well as over the word lines 120, the erase gate 128, and the logic gates. The formation of the silicide pads 146, 148, 150 may include: forming a conformal metal layer over the semiconductor structure; heat treating the semiconductor structure to invoke a reaction between the conformal metal layer, the semiconductor substrate 100, the word lines 1120, and the logic and erase gates 128; and removing the unreacted regions of the conformal metal layer. The silicide pads 146, 148, 150 are, for example, nickel silicide or titanium silicide.

Figure 13:
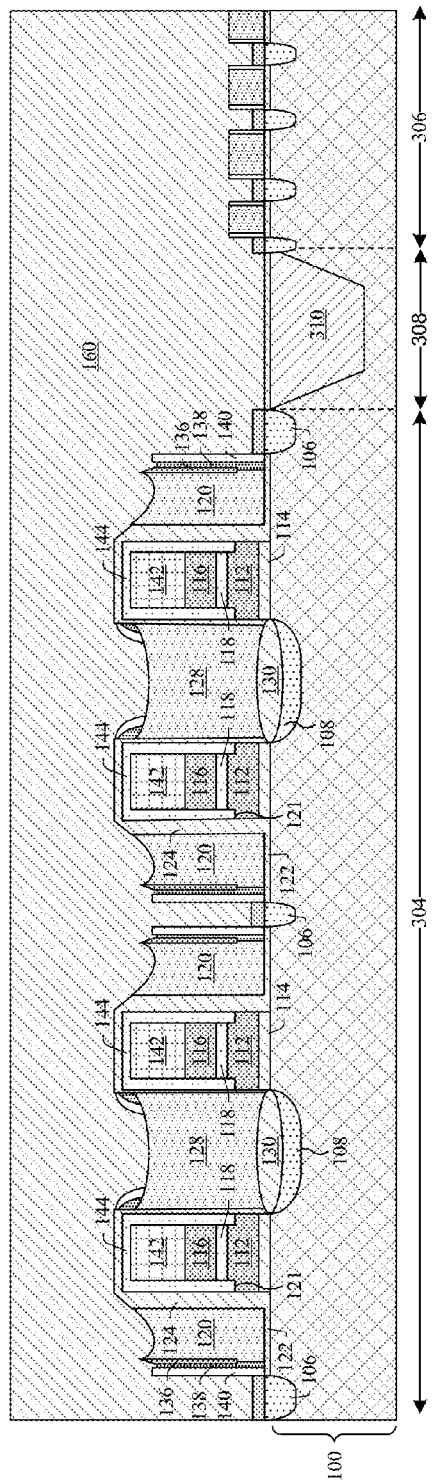

FIG. 13 illustrates a cross-sectional view of some embodiments corresponding to Act 220 of FIG. 2.

As illustrated by FIG. 13, a contact etch stop layer and an ILD layer 160 are formed, in that order, over the silicide pads, the gate stacks 301, the erase gates 128, the logic gates, and the word lines 120. The contact etch stop layer is, for example, silicon nitride, and the ILD layer 160 is, for example, an oxide, such as silicon dioxide, or a low κ dielectric. In some embodiments, the process for forming the ILD layer 160 includes forming an intermediate ILD layer and performing a chemical-mechanical planarization (CMP) of the intermediate ILD layer.

Figure 14:
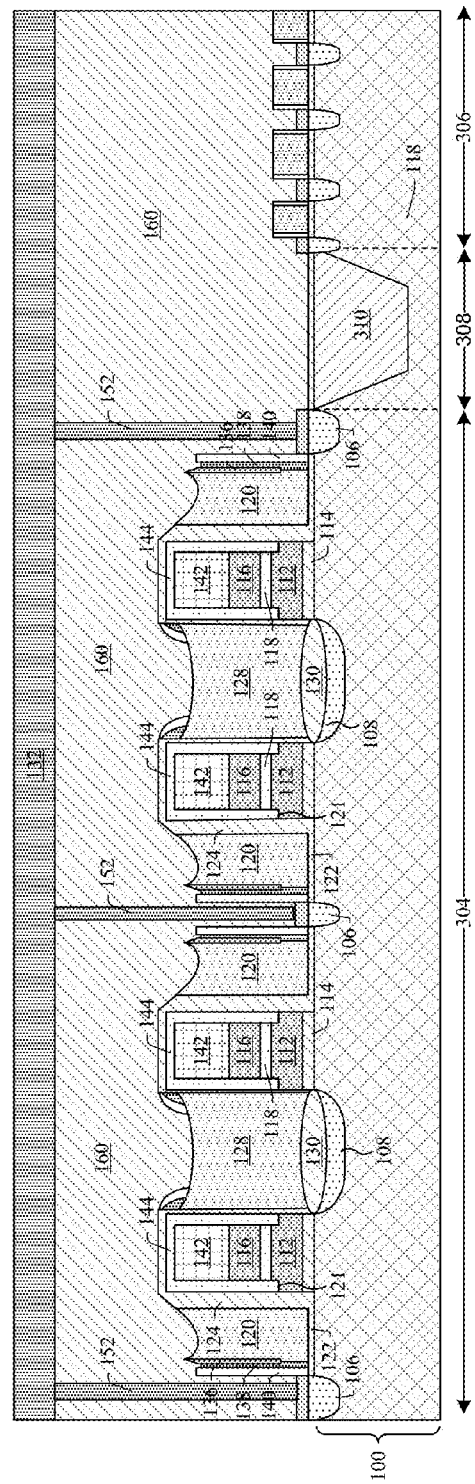

FIG. 14 illustrates a cross-sectional view of some embodiments corresponding to Act 222 of FIG. 2.

As illustrated by FIG. 14, contacts 152 are formed through the contact etch stop layer and the ILD layer 160 to one or more of the word lines 120, the erase gate 128, the control gates 116, the logic gates, the individual source/drain regions 106, and the logic source/drain regions. The contacts 152 are, for example, metal, such as tungsten.

Thus, as can be appreciated from above, some embodiments of the present disclosure relate to a flash memory device. The flash memory device includes first and second individual source/drain (S/D) regions spaced apart within a semiconductor substrate. A common S/D region is arranged laterally between the first and second individual S/D regions, and is separated from the first individual S/D region by a first channel region and is separated from the second individual S/D region by a second channel region. An erase gate is arranged over the common S/D. A floating gate is disposed over the first channel region and is arranged to a first side of the erase gate. A control gate is disposed over the floating gate. A wordline is disposed over the first channel region and is spaced apart from the erase gate by the floating gate and the control gate. An upper surface of the wordline is a concave surface.

In other embodiments, the present disclosure provides a flash memory device comprising a pair of split gate memory cells. The pair of split gate memory cells include first and second individual source/drain (S/D) regions spaced apart within a semiconductor substrate. A common S/D region is arranged laterally between the first and second individual S/D regions, and is separated from the first individual S/D region by a first channel region and is separated from the second individual S/D region by a second channel region. An erase gate is arranged over the common S/D. A first floating gate is disposed over the first channel region and to a first side of the erase gate. A first control gate is disposed over the first floating gate. A first wordline is disposed over the first channel region and is spaced apart from the erase gate by the first floating gate. The first wordline has an outer wordline sidewall facing the first individual S/D region. A first composite spacer includes a first inner layer which covers an upper region of the outer wordline sidewall but which leaves a lower region of the outer wordline sidewall un-covered. A first outer layer of the spacer extends along an outer sidewall of the first inner layer and extends downward along the un-covered lower region of the outer wordline sidewall.

In yet other embodiments, a method for manufacturing an embedded flash memory device is provided. In this method, a pair of floating gate transistor gate stacks are formed over a memory region of a semiconductor substrate. A polysilicon layer, a protective layer, and hard mask layer, are formed in that order over the semiconductor substrate and the gate stacks. A first mask is formed to cover the memory region and has openings over a logic region of the semiconductor substrate. The polysilicon layer, the protective layer, and the hard mask are patterned with the first mask in place. A second mask is formed to cover the logic region. Exposed portions of the hard mask and exposed portions of the protective layer are removed to form protective spacers over the memory region. With the second mask and protective spacers in place, portions of the polysilicon layer are etched back to form wordlines and erase gates over the memory region.

It will be appreciated that identifiers such as "first" and "second" do not imply any type of ordering, placement, or temporal relationship with respect to other elements; but rather "first" and "second" and other similar identifiers are just generic identifiers and these elements can be swapped in other implementations. For example, "a first dielectric layer" described in connection with a first figure may not necessarily corresponding to a "first dielectric layer" described in connection with another figure or un-illustrated embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A flash memory device comprising:
first and second individual source/drain (S/D) regions spaced apart within a semiconductor substrate;
a common S/D region arranged laterally between the first and second individual S/D regions, and being separated from the first individual S/D region by a first channel region and being separated from the second individual S/D region by a second channel region;
an erase gate arranged over the common S/D;
a floating gate disposed over the first channel region and to a first side of the erase gate, and a control gate disposed over the floating gate;
a wordline disposed over the first channel region and spaced apart from the erase gate by the floating gate and the control gate, wherein an upper surface of the wordline is a concave surface; and
a spacer arranged along an outer sidewall of the wordline, the spacer being separated from the control gate by the wordline and having a spacer tip at a first height, wherein the first height is greater than a second height which corresponds to a bottom region of the concave surface.

2. The flash memory device of claim 1, wherein the bottom region of the concave surface is spaced laterally apart from the outer sidewall of the wordline by a first distance and is sunken relative to the top of the wordline at the outer sidewall, and wherein the bottom region of the concave surface is spaced laterally apart from an inner sidewall of the wordline by a second distance, the first distance being different from the second distance.

3. The flash memory device of claim 1, wherein an outermost side of the concave surface has a third height, and an innermost side of the concave surface, which is opposite the outermost side and which is adjacent to the control gate, has a fourth height that is greater than the third height.

4. The flash memory device according to claim 1, wherein the spacer is a composite spacer including an inner layer and an outer layer;
wherein the inner layer covers an upper region of the outer sidewall of the wordline but leaves a lower region of the outer sidewall of the wordline un-covered; and
wherein the outer layer extends along an outer sidewall of the inner layer and extends downward along the un-covered lower region of the outer sidewall of the wordline.

5. The flash memory device of claim 4, wherein the composite spacer further includes an outermost layer extending along an outer sidewall of the outer layer, wherein the inner layer is made of a nitride material, the outer layer is made of oxide, and the outermost layer is made of the nitride material.

6. A flash memory device comprising a pair of split gate memory cells, the pair of split gate memory cells comprising:
first and second individual source/drain (S/D) regions spaced apart within a semiconductor substrate;
a common S/D region arranged laterally between the first and second individual S/D regions, and being separated from the first individual S/D region by a first channel region and being separated from the second individual S/D region by a second channel region;
an erase gate arranged over the common S/D;
a first floating gate disposed over the first channel region and to a first side of the erase gate, and a first control gate disposed over the first floating gate;
a first wordline disposed over the first channel region and spaced apart from the erase gate by the first floating gate, the first wordline having an outer wordline sidewall facing the first individual S/D region; and
a first composite spacer including a first inner layer and a first outer layer, the first inner layer covering an upper region of the outer wordline sidewall but leaving a lower region of the outer wordline sidewall un-covered, and the first outer layer extending along an outer sidewall of the first inner layer and extending downward along the un-covered lower region of the outer wordline sidewall.

7. The flash memory device of claim 6, wherein the first composite spacer further includes a first outermost layer extending along an outer sidewall of the first outer layer.

8. The flash memory device of claim 7, wherein:
the first inner layer is made of SiN and has a lateral thickness ranging between 20 angstroms and 100 angstroms;
the first outer layer is made of oxide and has a lateral thickness ranging between 100 angstroms and 200 angstroms; and
the first outermost layer is made of SiN and has a lateral thickness ranging between 200 angstroms and 300 angstroms.

9. The flash memory device of claim 6, wherein a top surface of the first wordline is a concave surface.

10. The flash memory device of claim 9, wherein a bottom region of the concave surface is spaced laterally apart from the outer wordline sidewall by a first distance and is spaced laterally apart from an inner wordline sidewall of the first wordline by a second distance, the first distance being smaller than the second distance.

11. The flash memory device of claim 9, wherein an outermost side of the concave surface, which is adjacent to the outer wordline sidewall, has a first height, and an innermost side of the concave surface, which is adjacent to the control gate, has a second height that is greater than the first height.

12. The flash memory device of claim 6, further comprising:
a hard mask over the control gate, wherein the first inner layer has an uppermost surface having a height that ranges between 50% and 95% of the height of the upper surface of the hard mask, as measured from an upper surface of the semiconductor substrate.

13. The flash memory device of claim 6, further comprising:
a second floating gate disposed over the second channel region and to a second side of the erase gate, and a second control gate disposed over the second floating gate;
a second wordline disposed over the second channel region and spaced apart from the erase gate by the second floating gate and the second control gate, the second wordline having an outer wordline sidewall facing the second individual S/D region; and
a second composite spacer including a second inner layer and a second outer layer, the second inner layer covering an upper region of the outer wordline sidewall but leaving a lower region of the outer wordline sidewall un-covered, and the second outer layer extending along an outer sidewall of the second inner layer and extending downward along the un-covered lower region of the outer wordline sidewall.

14. The flash memory device of claim 13, further comprising composite spacers over the erase gate.

15. The flash memory device of claim 6, further comprising:
- a logic gate with a top surface approximately even with a word line ledge;
- an interlayer dielectric (ILD) layer arranged over the erase gate and the word line; and
- a contact extending through the ILD layer to one of the erase gate and the word line.

16. The flash memory device of claim 6, further including:
silicide pads arranged over the word line and the erase gate.

17. A flash memory device comprising a pair of split gate memory cells, the pair of split gate memory cells comprising:
- first and second individual source/drain (S/D) regions spaced apart within a semiconductor substrate;
- a common S/D region arranged laterally between the first and second individual S/D regions, and being separated from the first individual S/D region by a first channel region and being separated from the second individual S/D region by a second channel region;
- an erase gate arranged over the common S/D;
- a first floating gate disposed over the first channel region and to a first side of the erase gate, and a first control gate disposed over the first floating gate;
- a first wordline disposed over the first channel region and spaced apart from the erase gate by the first floating gate, the first wordline having an outer wordline sidewall facing the first individual S/D region;
- a first inner spacer layer covering an upper region of the outer wordline sidewall but leaving a lower region of the outer wordline sidewall un-covered;
- a first intermediate spacer layer extending along an outer sidewall of the first inner layer and extending downward along the un-covered lower region of the outer wordline sidewall; and
- a first outermost spacer layer extending along an outer sidewall of the first intermediate spacer layer;
- wherein the first inner spacer layer, first intermediate spacer layer, and first outermost spacer layer reside entirely between an innermost edge of the first individual S/D region and the outer wordline sidewall of the first wordline.

18. The flash memory device of claim 17, wherein an upper surface of the first wordline is a concave surface.

19. The flash memory device of claim 18, wherein a bottom region of the concave surface is spaced laterally apart from an outer wordline sidewall by a first distance and is spaced laterally apart from an inner sidewall of the first wordline by a second distance, the first distance being different from the second distance.

20. The flash memory device of claim 18, wherein an outermost side of the concave surface has a first height, and an innermost side of the concave surface, which is opposite the outermost side and which is adjacent to the first control gate, has a second height that is greater than the first height.

* * * * *